United States Patent [19]

Masumi

[11] Patent Number: 4,990,487
[45] Date of Patent: Feb. 5, 1991

[54] SUPERCONDUCTIVE OPTOELECTRONIC DEVICES

[75] Inventor: Taizo Masumi, Yokohama, Japan

[73] Assignee: The University of Tokyo, Tokyo, Japan

[21] Appl. No.: 320,131

[22] Filed: Mar. 7, 1989

[30] Foreign Application Priority Data

Mar. 11, 1988 [JP] Japan .................................. 63-57844
Aug. 12, 1988 [JP] Japan ................................ 63-201655

[51] Int. Cl.$^5$ ...................... H01J 40/14; H01B 12/00; H01L 39/12
[52] U.S. Cl. ......................................... 505/1; 505/701; 505/702; 505/703; 250/211 J
[58] Field of Search ............... 505/701, 702, 703, 704, 505/1, 848, 849, 842; 250/211 J, 578, 336.2, 208.1; 357/30, 5; 307/306, 311

[56] References Cited

U.S. PATENT DOCUMENTS

| | | | |
|---|---|---|---|
| 3,193,685 | 7/1965 | Burstein | 505/848 |
| 4,464,065 | 8/1984 | Wolf et al. | 250/336.2 |
| 4,578,691 | 3/1986 | Murakami et al. | 357/59 |
| 4,647,954 | 3/1987 | Graf et al. | 357/4 |
| 4,814,598 | 3/1989 | Faris | 250/211 J |
| 4,843,446 | 6/1989 | Nishino et al. | 357/23.3 |

FOREIGN PATENT DOCUMENTS

| | | | |
|---|---|---|---|
| 0253929 | 12/1985 | Japan | 505/701 |
| 0271487 | 12/1986 | Japan | 250/336.2 |
| 0241809 | 10/1988 | Japan | 505/1 |
| 0245973 | 10/1988 | Japan | 505/701 |

OTHER PUBLICATIONS

Garland, "Fabrication of the $Bi_1Sr_1Ca_1Cu_2O_x$ High-Tc Superconductor", Appl. Phys. Letter 52 (22), 5/88, pp. 1913–1914.

Iguchi et al., "Measurements of the Nonradiative States of Optically Illuminated Semiconductors by a Superconducting Tunnel Junction", Appl. Phys. Letter 49(7), 8/86, pp. 371–373.

Talvacchio et al., "Photodetection with High-Tc Superconducting Films", *Science and Technology of Thin–Film Superconductors*, 1989, pp. 1–9.

Enmoto, Y. et al., Journal of Applied Physics 59:11 3807–3814 (1987).

Enmoto, Y., et al., Japanese Journal of Applied Physics 24:24–2 471–473 (1985).

Leung, M. et al., Applied Physics Letters 51:24 2046–2047 (1987).

Ito, M. et al., Applied Physics Letters 43:3 314–316 (1983).

"A Novel Spectral Photoconductivity of the Y–Cu–O, Y–Ba–Cu–O Correlative with Superconductivity", Journal of the Physical Society of Japan, vol. 56, No. 9, 9/87, pp. 3009–3012.

A Novel Spectral Photoconductivity of the La–Cu–O Correlative with Superconductivity Journal of the Physical Society of Japan, vol. 56, No. 9, pp. 3013–3016.

A Possible Mechanism in the High-Tc Superconductivity Reflected on the Photoconductivity, Journal of the Physical Society of Japan, vol. 56, No. 12, pp. 4261–4264.

*Primary Examiner*—David C. Nelms
*Assistant Examiner*—Michael Messinger
*Attorney, Agent, or Firm*—Sughrue, Mion, Zinn, Macpeak & Seas

[57] ABSTRACT

The disclosed superconductive optoelectronic device has a substrate, a photoconductive gate region formed on the substrate, and a source region and a drain region formed on the substrate at opposite sides of the gate region so as to face toward each other across the gate region. The source region and the drain region are made of a superconductive material. The gate region is made of such superconductive photoconductive-material, which reveals photoconductivity at a temperature below the transition temperature of the above superconductive material and has a similar general chemical formula to that of the above superconductive material except that concentrations of constituent elements are different. Also disclosed are superconductive optoelectronic devices formed of an organized integration of the above superconductive optoelectronic devices to develop a new field of "Superconductive Opto-Electronics".

13 Claims, 22 Drawing Sheets

FIG_8

FIG_13

FIG_16
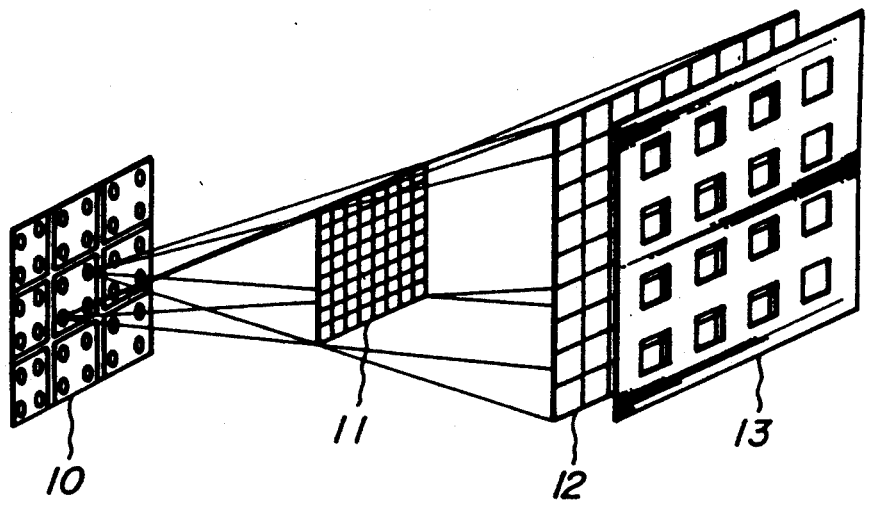

FIG_17
(a)
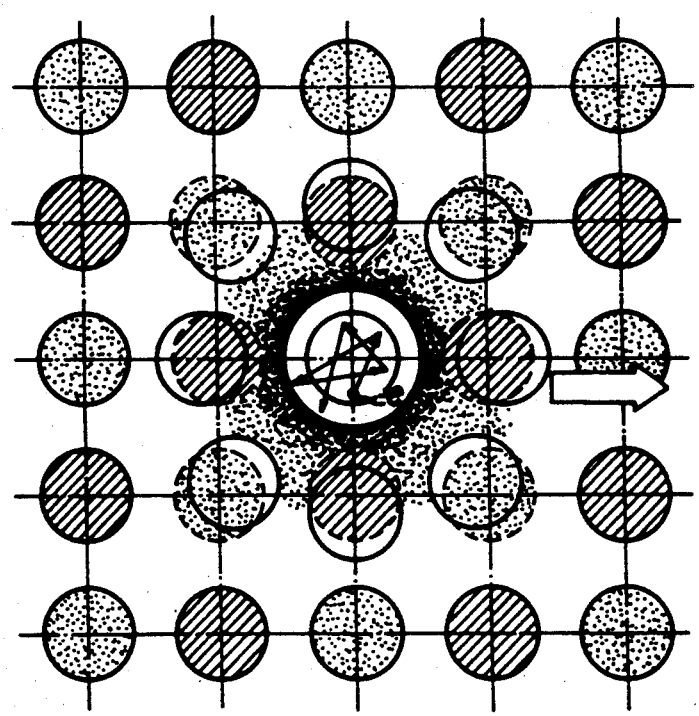

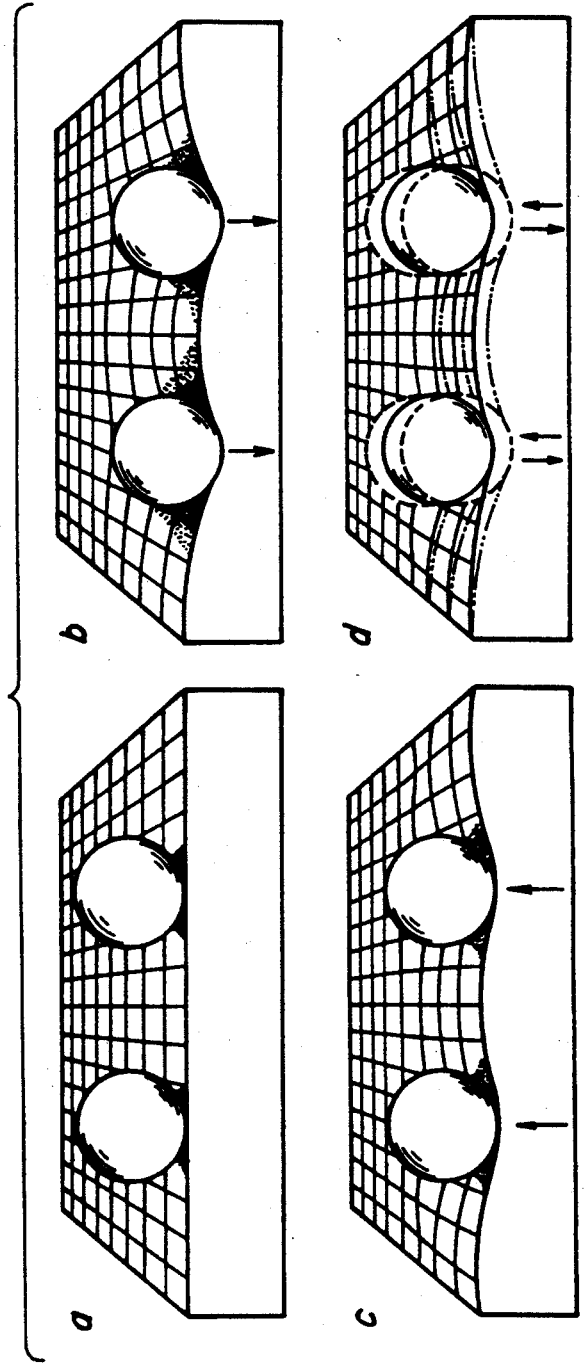
FIG_17 (b)

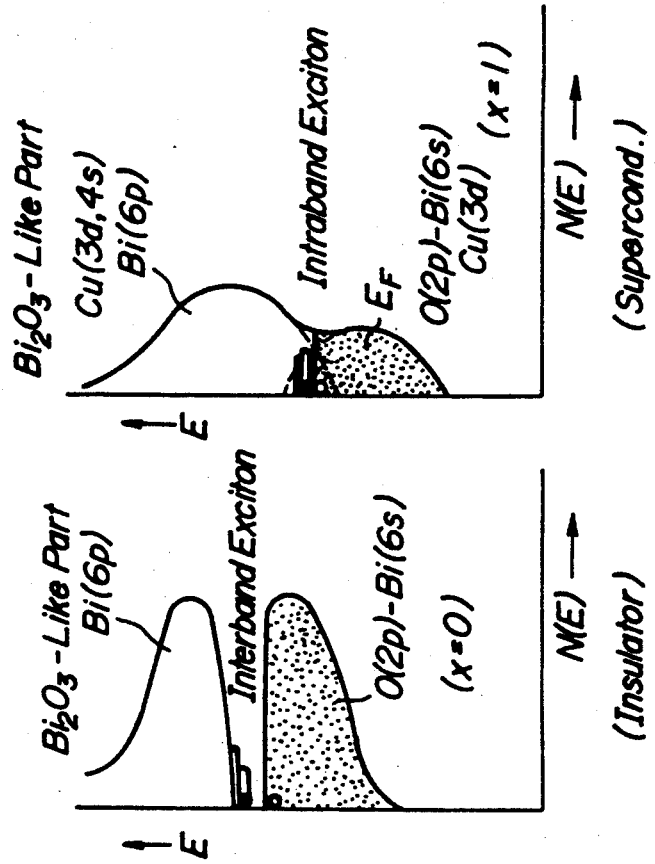

Ba-Pb$_{1-x}$-Bi$_x$-O$_3$

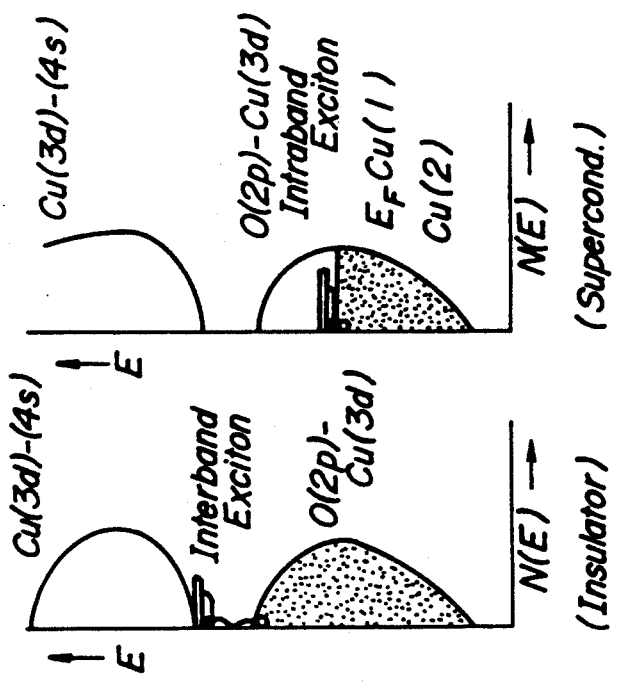

SUPERCONDUCTIVE OPTOELECTRONIC DEVICES

BACKGROUND OF THE INVENTION

1. Fields of the Invention

This invention relates to a number of superconductive optoelectronic device and a superconductive optoelectronic apparatus. The superconductive optoelectronic devices and apparatuses of the invention are novel and vastly different from those of prior art in that the invention uses a combination of superconductive material and special superconductive photoconductive-material which reveals photoconductivity below the critical temperature of the relevant superconductive material.

2. Description of the Prior Art

With recent development of superconductive materials, various new superconductive substances have been found; for instance, superconductive oxide materials such as those of Y-Ba-Cu-O system and Ca-Sr-Bi-Cu-O systems. However, most of current research effort are focussed on the raising of transition temperature or critical current, and not much studies except those on the reflection or scattering have been made on either optical properties of superconductive substance or industrial applications of such optical properties. The reason for it is in that, generally speaking, researchers have considered that superconductivity is incompatible with such physical properties as optical absorption and photoconductivity and they have assumed that optical irradiation in the region of an excess amount of energy with the relevant wave number beyond the energy gap of the BCS theory will merely destroy the stability of superconductivity. Further, most of the superconductive materials which have been developed so far are metals or alloys, and no superconductive materials with useful optical properties have been found. The superconductive photoconductive property was discovered by the present Applicant, and has hitherto not been reported other than by the present Applicant.

On the other hand, if high-temperature superconductive oxide material are combined with recently developed superconductive photoconductive-materials which reveal their proper photoconductivity at temperatures below the transition temperatures of the relevant superconductive oxide materials, a number of new electronic devices and optoelectronic apparatuses may be developed, for instance, a switching device with no power loss, an optically operating device with no power loss, an optically operating logical device, a space parallel type optically operating apparatus, a camera or an image forming device possibly with superconducting wiring, a high-speed optically operating apparatus to be driven at an extremely low power, and the like.

SUMMARY OF THE INVENTION

Although most researchers currently aim at the raising of transition temperatures of superconductive materials, the inventor has performed a number of experiments and analyses on optical properties of superconductive oxide materials, such as those of the Y-Ba-Cu-O and La-Cu-O system, Ca-Sr-Bi-Cu-O system and Ba-Pb-Bi-O system. Consequently, the inventor has discovered an entirely new and remarkable phenomenon in that some of the above oxide materials, i.e., superconductive photoconductive-materials to be defined later, reveal onsets of photoconductivity at temperatures below the critical temperature for superconductivity (transition point) of that superconductive substance which is related to the superconductive photoconductive-material. The superconductive photoconductive-oxide materials are so far electric insulators at room temperature, but when they are cooled down to the temperatures below the transition points of superconductive materials related to them, they reveal photoconductivity, i.e., they produce photo-carriers and their conductivity varies depending on the intensity of the excitation light which is incident thereto.

A power-loss-free useful superconductive optoelectronic device can be formed by combining a superconductive photoconductive-material of for instance the Ca-Sr-Bi-Cu-O system with its related superconductive material of for instance the Ca-Sr-Bi-Cu-O system. What is meant by "superconductive optoelectronic device" is an optoelectronic device made of a combination of a superconductive material of one oxide system and that superconductive photoconductive-material of the same oxide system which reveals photoconductivity at temperatures below the critical temperatures of the superconductive material.

An object of the invention is to provide a novel superconductive optoelectronic device by using effectively the optical properties of that superconductive photoconductive-material which is discovered by the inventor. Thus, the invention is neither a mere improvement of the prior art nor a simple solution of problems existing in the prior art, but an entirely new achievement.

A superconductive optoelectronic device according to the present invention, for instance, comprises a substrate, a photoconductive gate region formed on the substrate, and a source region and a drain region formed on the substrate at opposite sides of the gate region respectively so as to face toward each other across the gate region. The source and drain regions are made of a superconductive material, while the gate region is made of a superconductive photoconductive-material which reveals photoconductivity at temperatures below the critical temperature for superconductivity of the superconductive material, and the superconductive photoconductive-material and the superconductive material are of the same general chemical formula but with different contents of constituent elements.

Bias source may be connected across the source region and the drain region of the optoelectronic devices of the invention, so as to drive an electric current through its photoconductive gate region depending on the intensity of light which is incident to the photoconductive gate region.

Once such a type of superconductive optoelectronic device is formed, it must be naturally straight forward to develop the new field from such a device to other devices, and eventually to superconductive optoelectronic apparatus, for instance a switching device with no power loss, an optically operating device with no power loss, an optically operating logical device, a space parallel type optically operating device, a camera or an image forming device possibly with superconducting wiring, a high-speed optically operating apparatus to be driven at an extremely low power, and the like.

BRIEF DESCRIPTION OF THE DRAWINGS

For a better understanding of the invention, reference is made to the accompanying drawings, in which:

FIG. 16 is a diagrammatic illustration of a space parallel optically operating superconductive optoelectronic apparatus which uses alleys of the superconductive optoelectronic devices of the invention;

FIGS. 17 illustrate the concepts of (a) a "polaron", i.e., a conduction electron or a positive hole associated with LO-phonons or deformation of host crystal lattice together in free motion; (b) a "bipolaron" mediated via a coherent ensemble of phonons or lattice deformations;

Figure 1:
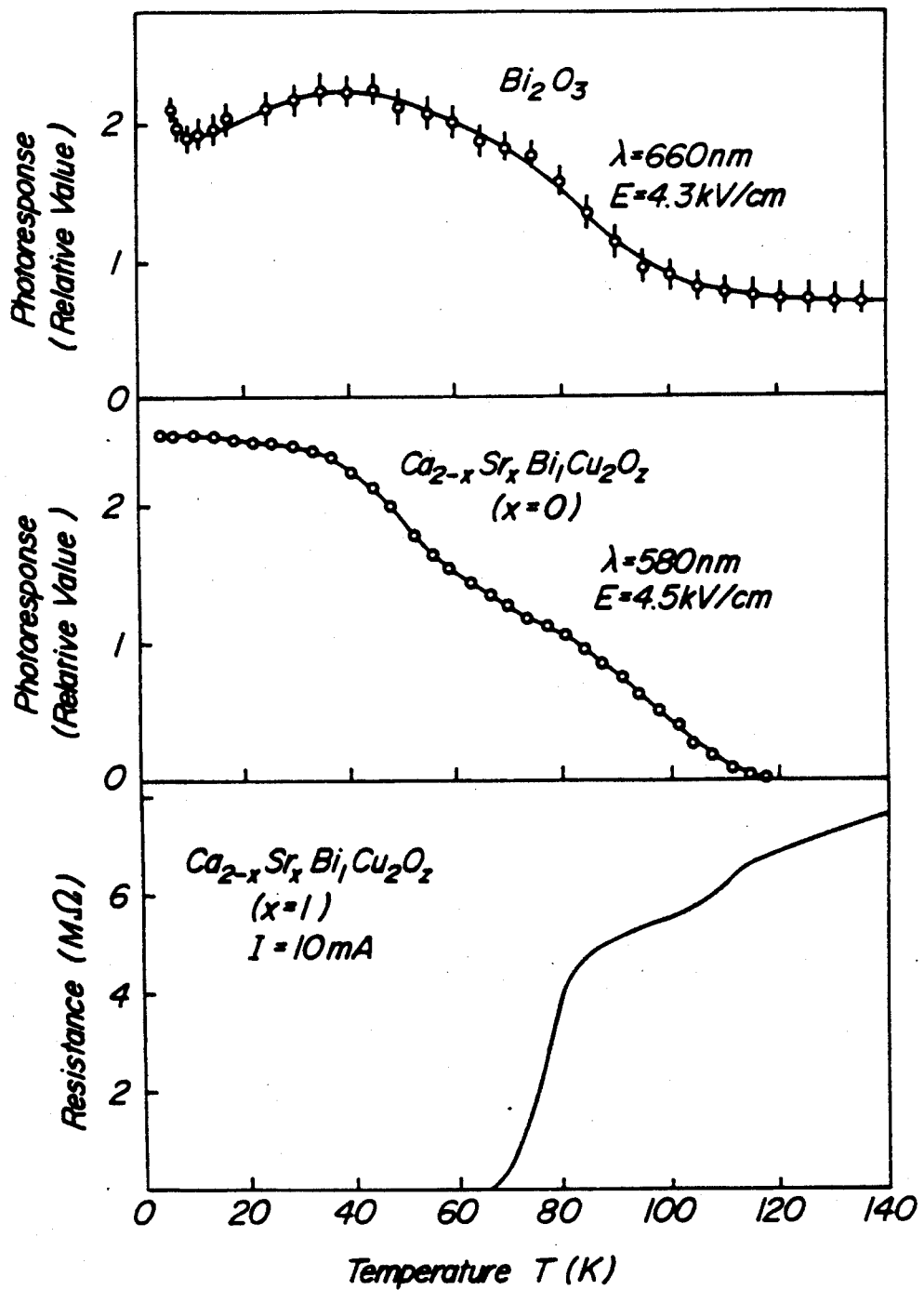
FIG. 1(a) is a graph showing the photoresponse $Q(T,\lambda)$ of the reference substance $Bi_2O_3$ at $\lambda=660$nm as a function of temperature T(K).
FIG. 1(b) is a graph showing the photoresponse $Q(T,\lambda)$ of the substance $Ca_{2-x}Sr_xBi_1Cu_2O_z$ (x=O) at $\lambda=580$nm as a function of temperature T(K).
FIG. 1(c) is a graph showing the electrical resistance of the substance $Ca_{2-x}Sr_xBi_1Cu_2O_z$ (x=1) in the dark as a function of temperature T(K).

Throughout different views of the drawing in FIGS. 14~16, 1 is a substrate, 2 a gate region, 3 a source region, 4 a drain region, 5 an insulating layer, 6 a conductive glass layer, 10 an alley-like light source, 11 a coding image-mask pattern, 12 a correlative image screen, and 13 is a decoding mask optical element alley.

DESCRIPTION OF THE PREFERRED EMBODIMENTS

The inventor's experiments and analyses on the photoconductivity and superconductivity of various superconductive materials showed that a certain portions of superconductive materials in their phase diagram reveal photoconductivity complementary to or as well as superconductivity at temperature below their regions of transition temperatures from normal conductivity to superconductivity. For instance, in the case of superconductive oxides of the Ca-Sr-Bi-Cu-O system, the inventors discovered that with changing Sr content their superconductivity can be converted into photoconductivity at temperatures below their critical temperatures.

FIG. 1 illustrates typical results of experiments on the superconductivity and photoconductivity of the Ca-Sr-Bi-Cu-O system oxides. The curve (a) in FIG. 1 shows the temperature dependence of photoconductivity of $Bi_2O_3$ ceramics which is a reference substance clarified by the inventor. The curve (b) in FIG. 1 illustrates the temperature dependence of superconductive photoresponse of $Ca_{2-x}Sr_xBi_1Cu_2O_z$ ($x=0$). The curve (c) in FIG. 1 illustrates the temperature dependence of electric resistance of $Ca_{2-x}Sr_xBi_1Cu_2O_z$ ($x=1$) in the dark. After a number of experiments and analyses on the Ca-Sr-Bi-Cu-O system oxides with a general chemical formula of $Ca_{m-x}Sr_xBi_{n-y}Cu_yO_z$, the inventors found that, under the conditions of $2 \leq m \leq 4, 3 \leq n \leq 5, 0 \leq x \leq 2, 1 \leq y \leq 3, 4 \leq z \leq 11$, if the content x of Sr is between 1 and 2, i.e., $1 \leq x \leq 2$, the oxides reveals superconductivity, while if the content x of Sr is not more than 1, i.e., $0 \leq x < 1$, the oxides reveals photoconductivity.

More particularly, with $m=2$, $n=3$, $y=2$ under the above-mentioned conditions, the Ca-Sr-Bi-Cu-O system reveals superconductivity if, e.g., its content x of Sr is in the range of $0.7 \sim 1 \leq x \leq 2$, and if its content x of Sr is smaller than $0.7 \sim 1$ such superconductivity disappears and it reveals complementary photoconductivity at temperature regions below their transition temperatures. Those materials whose superconductivity is converted into complementary photoconductivity and vice versa depending on the concentration of a part of their ingredient atoms at temperature regions below their transition point temperatures will be referred to as "superconductive photoconductive-materials" and their property will be referred to as 37 superconductive photoconductivity" herein.

Figure 2:
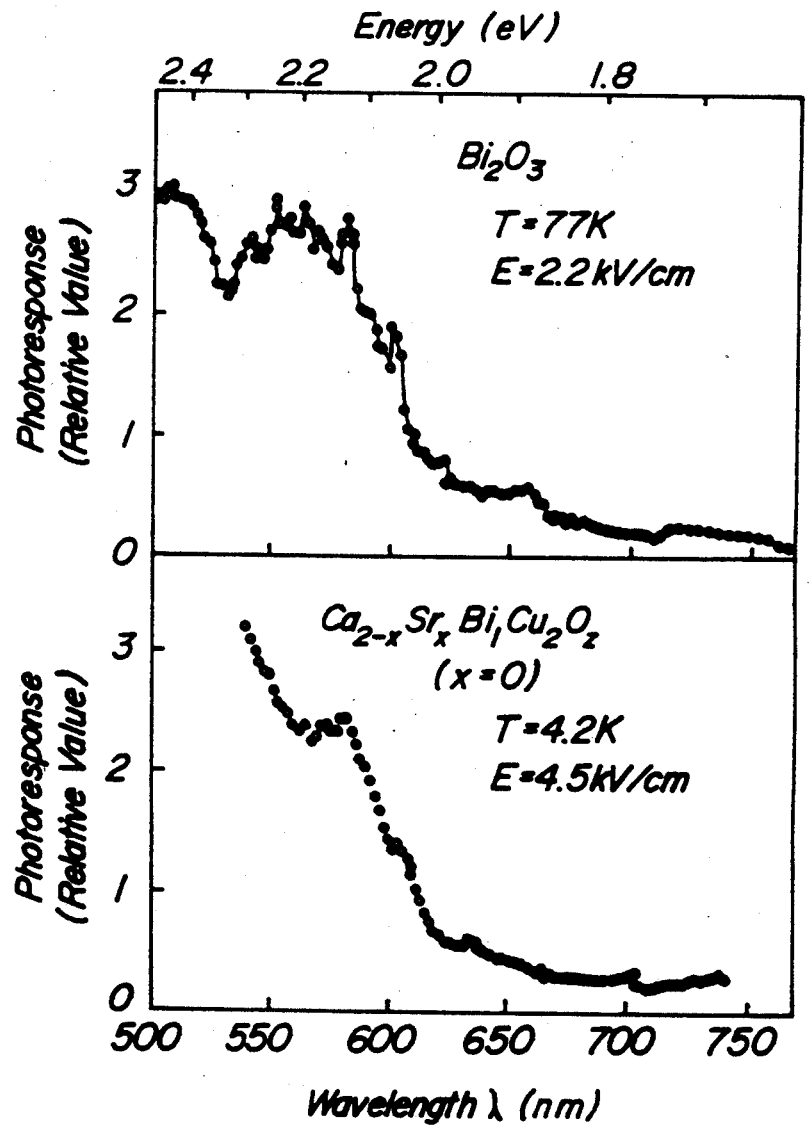
FIG. 2(a) is a graph showing the photoresponse $Q(T,\lambda)$ of the reference substance $Bi_2O_3$ at a temperature of T=77K as a function of incident wavelength $\lambda$ (nm).
FIG. 2(b) is a graph showing the photoresponse $Q(T,\lambda)$ of the substance $Ca_{2-x}Sr_xBi_1Cu_2O_z$ (x=0) at a temperature of T=4.2K as a function of wavelength $\lambda$ nm.

Curves (a) and (b) in FIG. 2 display wavelength dependence of photoresponse of the reference substance and the oxide specimen $Bi_2O_3$ ceramics at $T \approx 77K$ and $Ca_{2-x}Sr_xBi_1Cu_2O_z$($x=0$) at 4.2 K, respectively. The reference substance $Bi_2O_3$ ceramics and the oxide $Ca_{2-x}Sr_xBi_1Cu_2O_z$($x=0$) have similar wavelength dependences; more specifically, as the wavelength λ decreases from 650 nm, their photoresponse Q (T, λ) gradually increases, whereas their photoresponses remain substantially at low levels for wavelengths longer than 650 nm. The inventors noted that if a material revealing photoconductivity at a temperature below its transition temperature is combined with another material revealing superconductivity at a temperature below its transition temperature, then such a combination will provide a useful superconductive optoelectronic device which reveals both superconductivity and photoconductivity at a temperature below the transition temperature thereof.

More specifically, if an optoelectronic element of FET-like shape is formed by making a gate region with a superconductive photoconductive-material while making a source region and a drain region with a relevant superconductive material, an output current whose magnitude varies depending on the wavelength and intensity of light incident to the gate region can be produced so as to flow across the source and drain regions. If such an optoelectronic device is sustained at a temperature below the transition temperature of its superconductive material, it must work as a superconductive optoelectronic device which can be used in numerous ways; for instance, as a power-loss-free optical switching device with high-speed response, an optical detector, an optical signals amplifying device, or the like.

In order to obtain more systematic knowledge on the characters of material systems in a series of compositions, e.g., the effect of the composition on the variations of lattice constants in a crystal structure, the inventor has studied also the $(Ca_{1-x}Y_x)Sr_2Bi_2Cu_2O_z$ system to obtain data especially from the view point of photoconductivity complementary to superconductivity together with new data of the reference substance $Bi_2O_3$ single crystals. [Characteristic features of this series of system such as the variations of lattice constants, electrical resistivity in the dark and a magnetic susceptibility with varying x have been studied in details by T. Tamegai et al. Jpn. J. Appln. Phys. 27 L1074 (1988) and T. Tamegai, Parity Vol.3, No. 11, 43 (1988) (in Japanese).]The single crystals of $Bi_2O_3$ have been grown for the first time in the inventor's laboratory.

FIG. 3(a) and (b) illustrate typical traces of the temperature dependences of photoconductivity signals Q (T, λ) of the reference substance $Bi_2O_3$ single crystal and of the $Ca_{1-x}Y_xSr_2Bi_2Cu_2O_z$ ($x=1$) specimen of oxide ceramics, whereas FIG. 4(a) and (b) show the temperature dependences of resistivity in the dark of the $Ca_{1-x}Y_xSr_2Bi_2Cu_2O_z$ system ($x=1 \sim 0$) to display an insulator to superconductor transition between $x \approx 0.55$ and $x \approx 0.6$.

Figure 5:
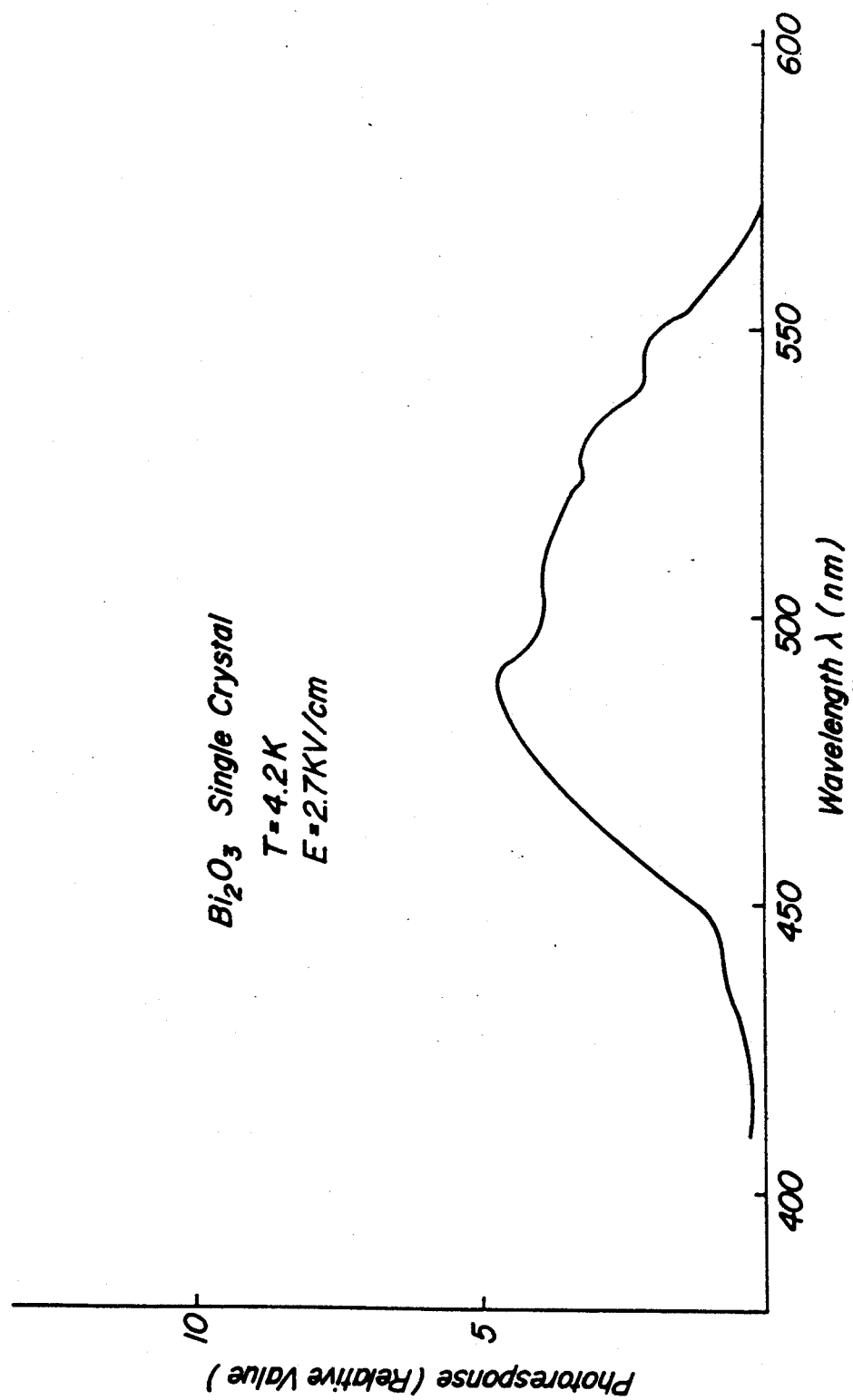
FIG. 5 is a graph showing the photoresponse $Q(T,\lambda)$ of the reference substance $Bi_2O_3$ at a temperature T=4.2K as a function of wavelength $\lambda$(nm).

With these data, one can definitely recognize even another more systematic series of material $Ca_{1-x}Y_xSr_2Bi_2Cu_2O_z$ also exhibits an emergence of superconductive photoconductivity at $x \approx 1$, but rather low temperature $T \approx 20K$. In FIG. 5, the graph displays the wavelength dependences of the photoconductivity Q (T, λ) of the reference substance $Bi_2O_3$ single crystal. This is not necessarily inconsistent with the data in FIG. 2(a), since thickness of specimens and proportion of the surface to volume ratio are different from each other.

Figure 3:
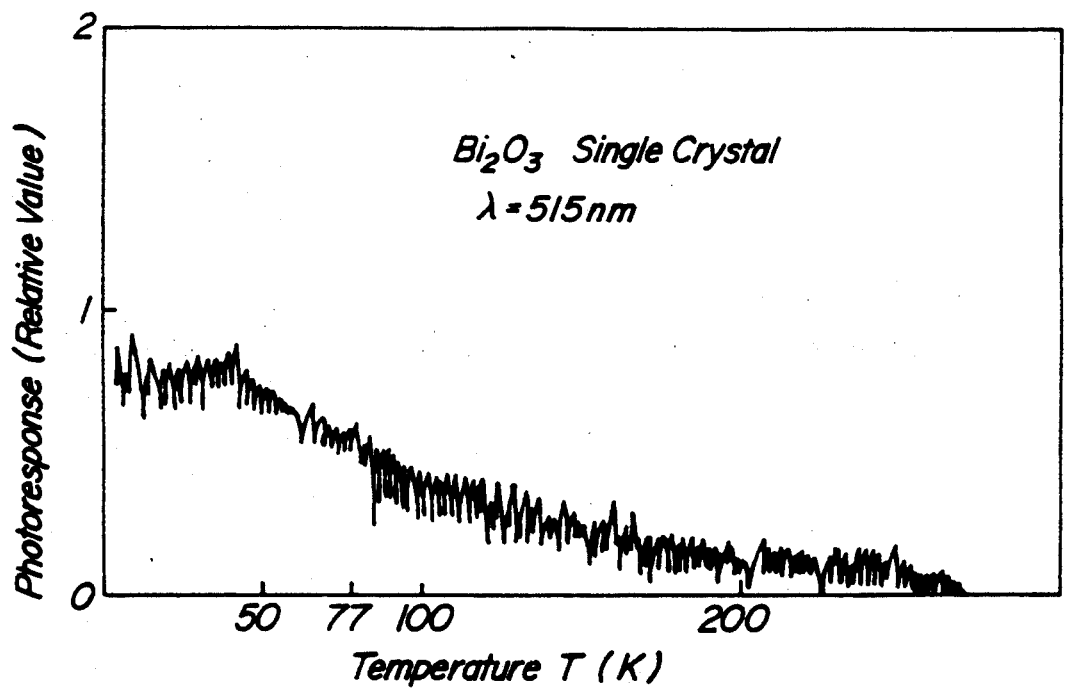
FIG. 3(a) is a graph showing the photoresponse $Q(T,\lambda)$ of the reference substance $Bi_2O_3$ at a wavelength $\lambda=515$nm as a function of temperature T(K).
FIG. 3(b) is a graph showing the photoresponse $Q(T,\lambda)$ of the substance $Ca_{1-x}-Y_x-Sr_2-Bi_2-Cu_2-O_z$ (x=1) as a function of temperature T(K).
Figure 3:
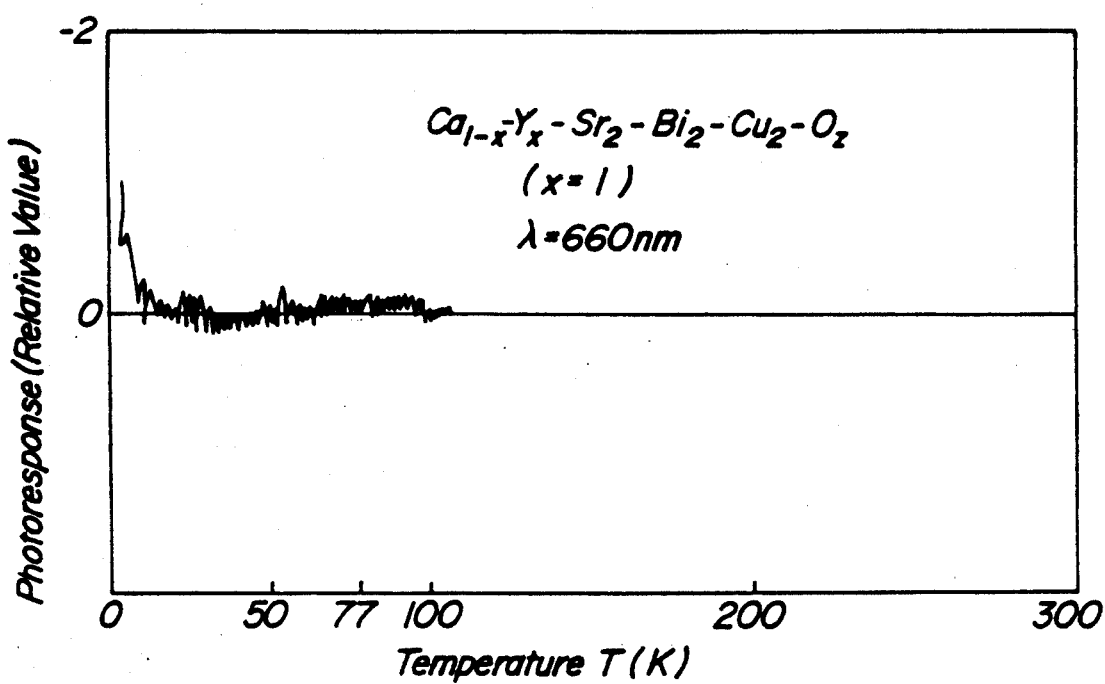
Figure 4:
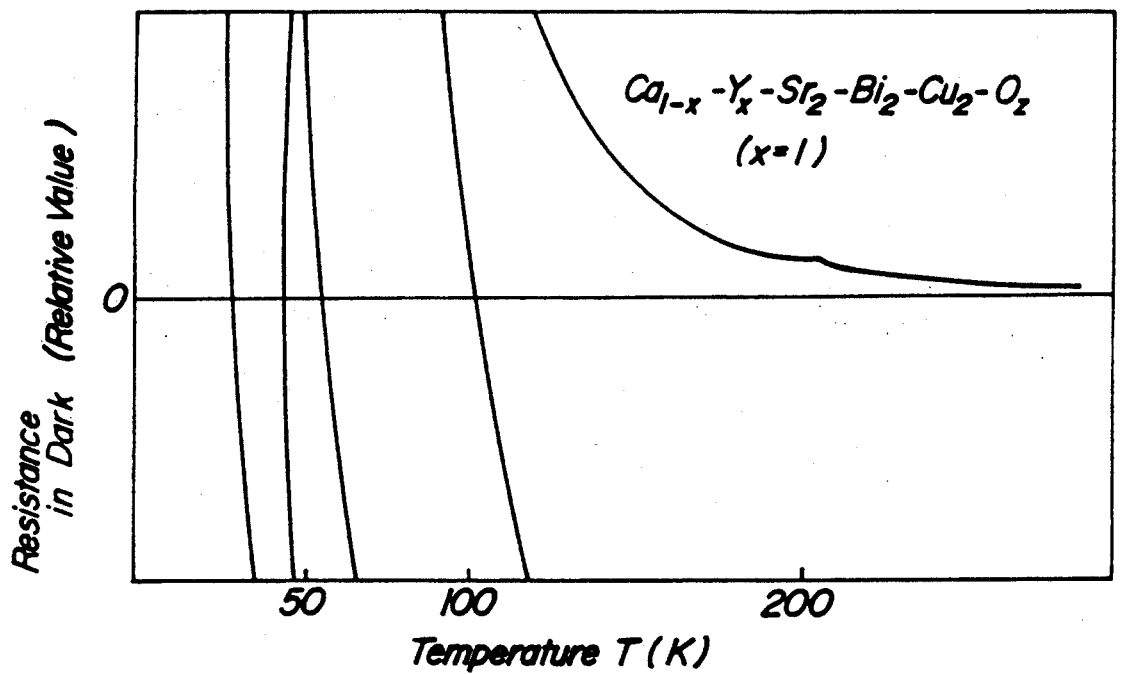
FIG. 4(b) is a graph showing the electrical resistance in the dark of the substance $Ca_{1-x}-Y_x-Sr_2-Bi_2-Cu_2-O_z$ as a function of temperature T(K) for various values of x.
Figure 4:
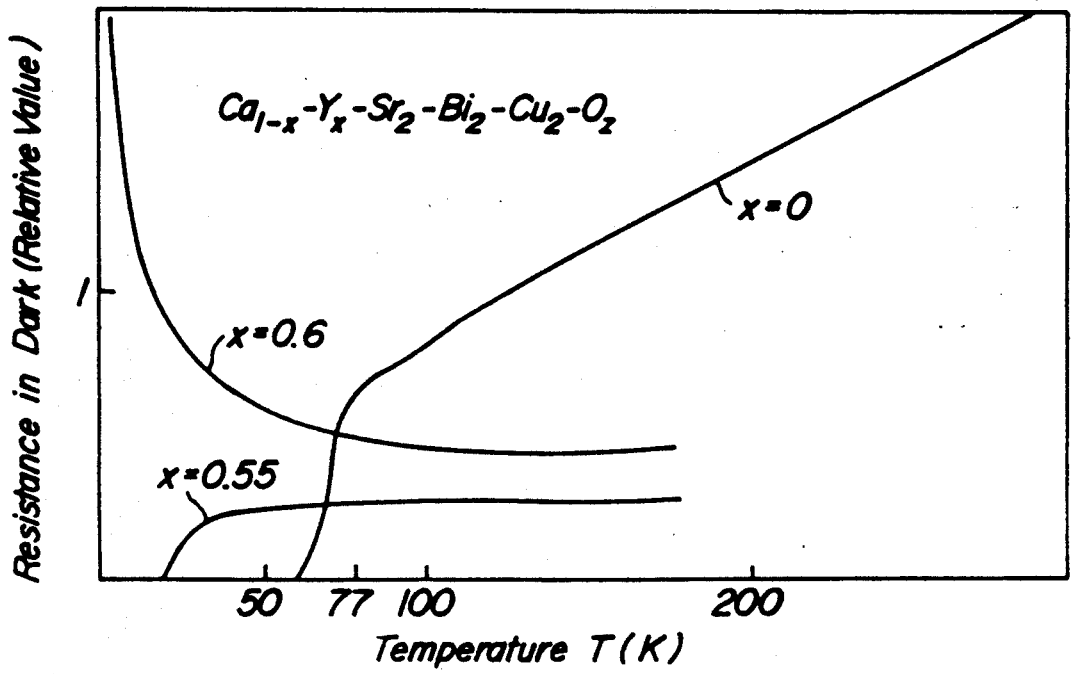
Figure 6:
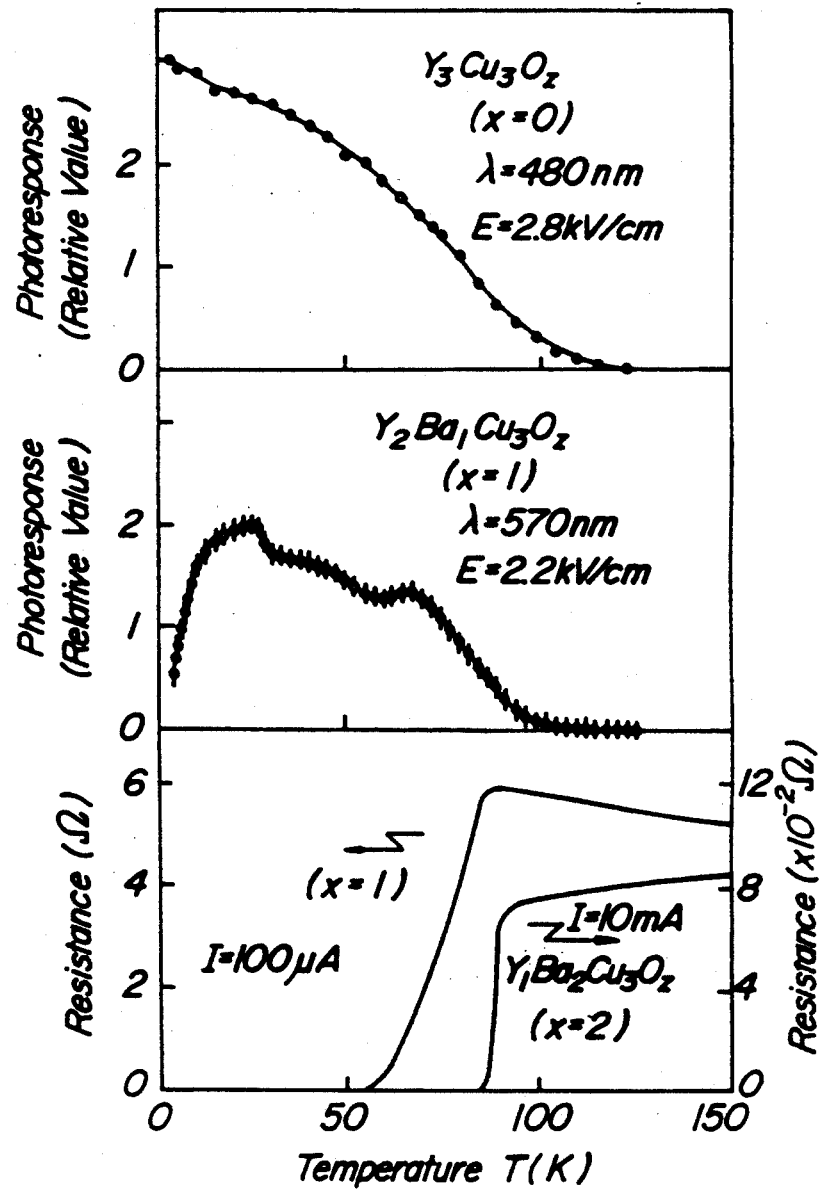
FIG. 6(a) is a graph showing the photoresponse $Q(T,\lambda)$ of the substance $Y_3Cu_3O_z$ (x=0) at a wavelength $\lambda=480$nm as a function of temperature T(K).
FIG. 6(b) is a graph showing the photoresponse $Q(T,\lambda)$ of the substance $Y_2Ba_1Cu_3O_z$ (x=1) at a wavelength $\lambda=570$nm as a function of temperature T(K).
FIG. 6(c) is a graph showing the electrical resistance in the dark of the substance $Y_1Ba_2Cu_3O_z$ for (x=1) and (x=2) as a function of temperature T(K).

Oxide material of the Y-Ba-Cu-O system will be described now by referring to FIG. 6 which shows test results on its superconductivity and photoconductivity. The curve (a) in FIG. 6 shows the temperature dependence of photoresponse Q (T, λ) of $Y_{3-x}Ba_xCu_3O_z$ ($x=0$), the curve (b) shows the temperature dependence of photo-response Q (T, λ) of $Y_{3-x}Ba_xCu_3O_z$ ($x=1$), and curves (c) in FIG. 3 show the temperature dependence of dark resistivity of two specimens of $Y_{3-x}Ba_xCu_3O_z$ (X=1, x=2). In the case of Y-Ba-Cu-O system oxides with a general chemical formula of $Y_{3-x}Ba_xCu_yO_z$, their Superconductivity is converted into photoconductivity depending on both the content x of Ba and the content z of oxygen. Under the conditions of $1 \leq x \leq 2$ and $6.5 \leq z \leq 7$, the oxides reveal superconductivity, while under the conditions of $0 \leq x \leq 1$ and $7.0 \leq z \leq 7.5$, or $x=2$ and $6.0 \leq z < 6.5$, the oxides reveal photoconductivity at temperatures below their transition temperatures. Here, $z < 6.5$ is a merely rough indication of the boundary not clearly and should not be taken exactly, since the superconductive defined photoconductive-area are continuously close to the superconductive-area in their phase diagram. Similar situations are the cases also for the other systems as far as the oxygen content z concerns.

As can be seen from the curves (a) and (b) in FIG. 6, the two specimens of $Y_{3-x}Ba_xCu_3O_z$ ($x=0$, $x=1$)

clearly reveal superconductive photoconductivity at temperatures below their transition temperatures.

Figure 7:
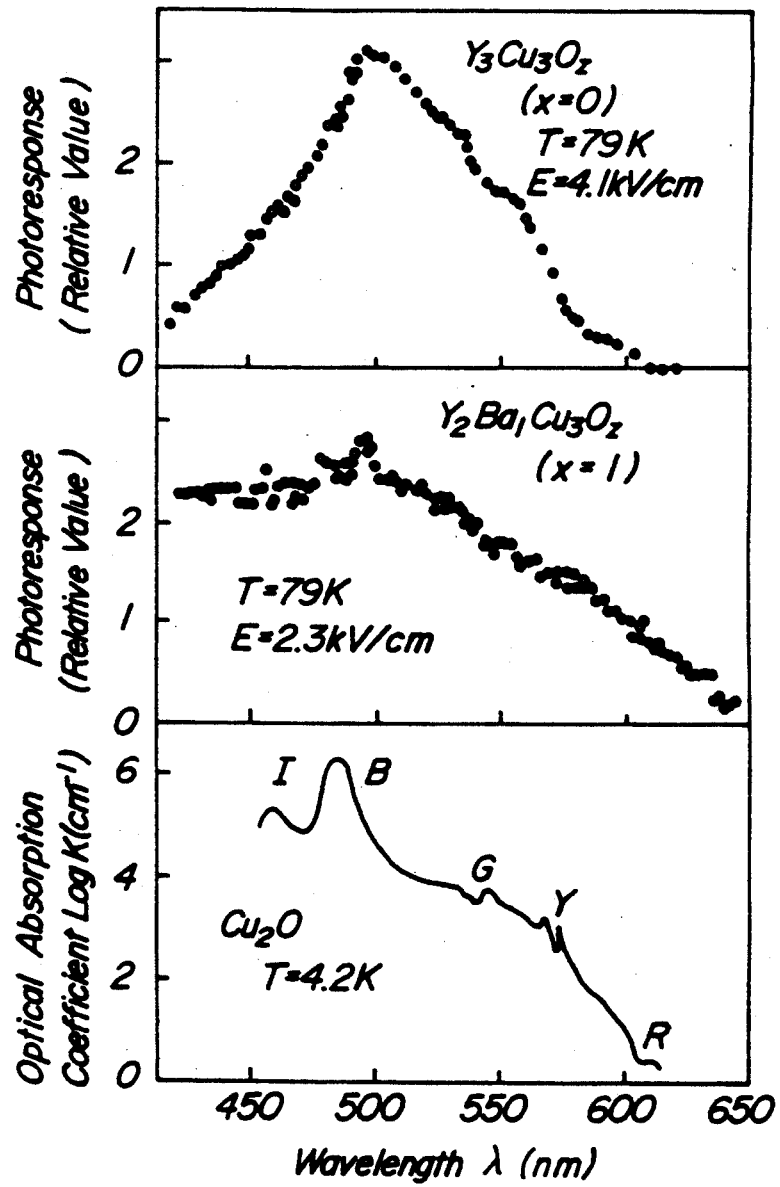
FIG. 7(a) is a graph showing the photoresponse $Q(T,\lambda)$ of the substance $Y_3Cu_3O_z$ (x=0) at a temperature of T=79K as a function of wavelength $\lambda$(nm).
FIg. 7(c) is a graph showing the optical absorption coefficient of the reference substance $Cu_2O$ at a temperature of T=4.2K as a function of wavelength $\lambda$(nm).
Figure 8:
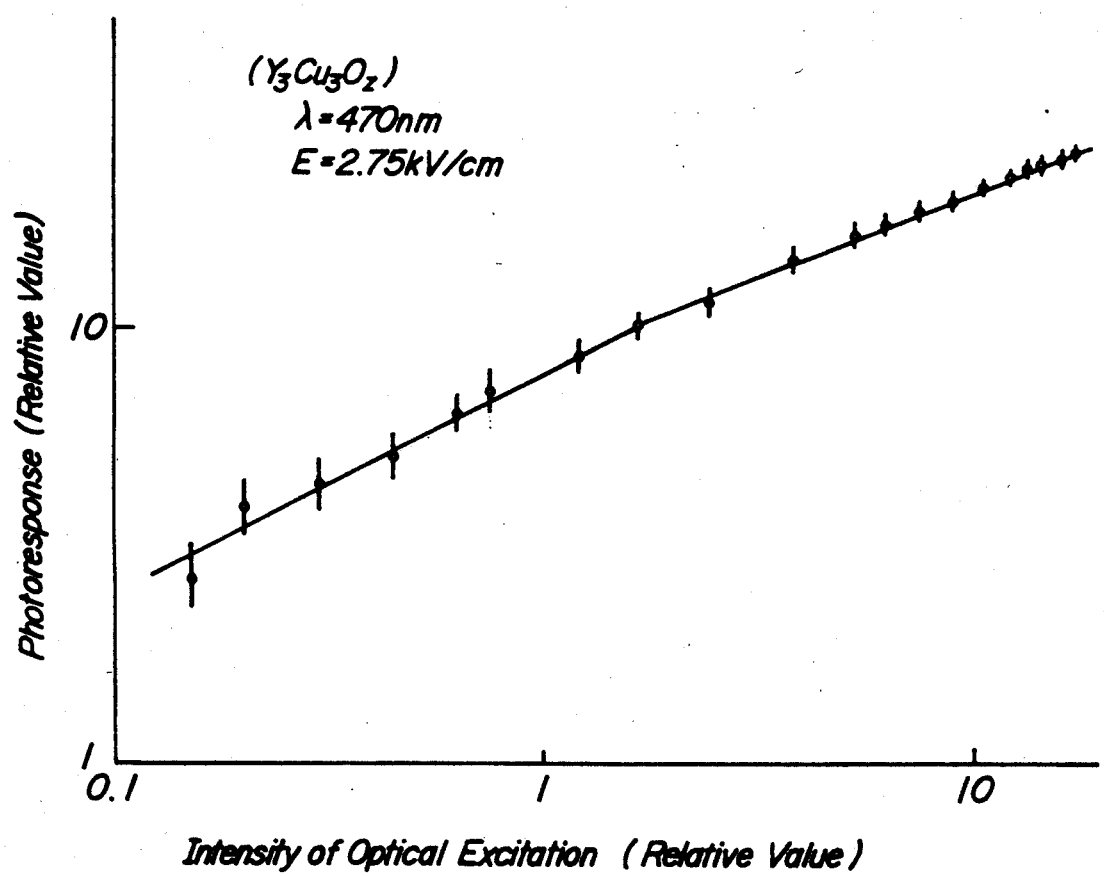
FIG. 8 is a graph which shows the relationship between the intensity of light excitation and photoconductive response of the Y-Ba-Cu-O system oxide $Y_2Cu_3O_z$ (X=0) at a wavelength $\lambda=470$nm.

FIG. 7 shows the dependence of photoconductivity $Q(T, \lambda)$ of the above Y-Ba-Cu-O system oxides on the wavelength $\lambda$ of excitation light at a temperature $T=79$ K. As can be seen from FIG. 7, the oxides reveal intrinsic photoconductivity at a temperature below their transition temperatures in response to excitation light with wavelength at $\lambda \simeq 420-640$ nm. FIG. 8 shows the dependence of the photoconductivity of the similar oxide ($x=0$) system on the intensity of excitation light at a wavelength $\lambda = 470$ nm. It may be concluded from FIG. 8 that photoresponse signals $Q(T, \lambda)$ of the oxide material of $Y_{3-x}$-$Ba_x$-$Cu_3$-$O_z$ system increases with the intensity of the excitation light. The inventors found that the $Y_{3-x}$-$Ba_x$-$Cu_3$-$O_z$ system oxide becomes a superconductive photoconductive-material when its Ba concentration x is in a range $0 \leq x \leq 1$, while it becomes a superconductive material for $1 \leq x \leq 2$.

Figure 9:
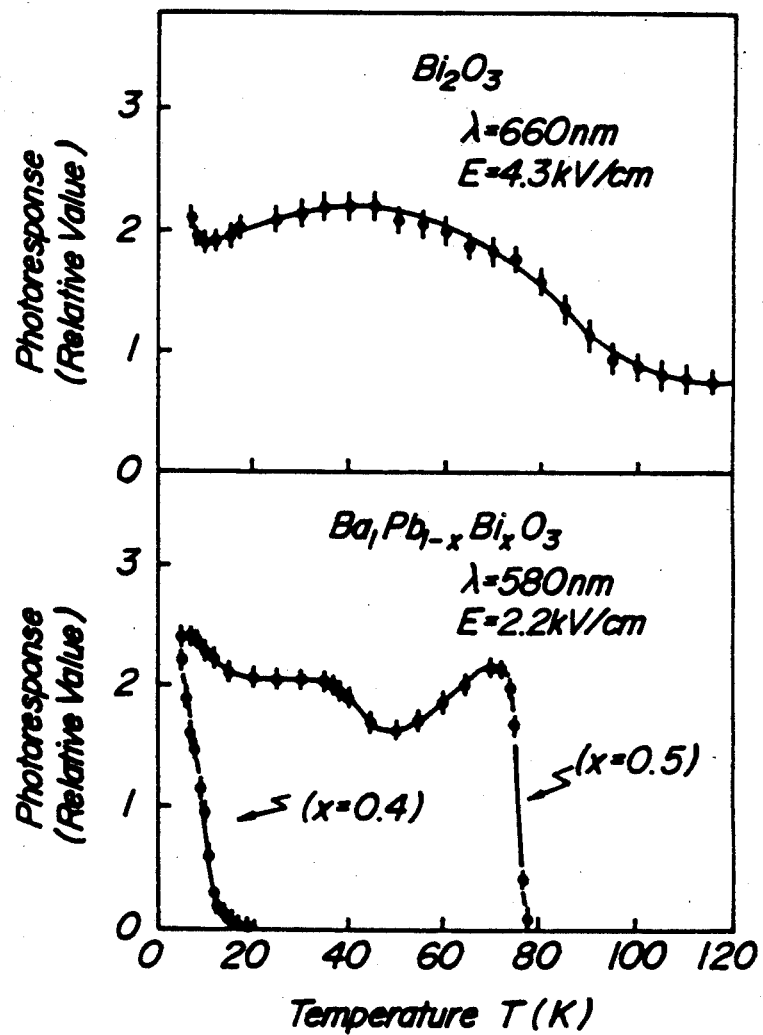
FIG. 9(a) is a graph showing the photoresponse $Q(T,\lambda)$ of the reference substance $Bi_2O_3$ at a wavelength of $\lambda=660$nm as a function of temperature T(K).
FIG. 9(b) is a graph showing the photoresponse $Q(T,\lambda)$ of the substance $Ba_1Pb_{1-x}Bi_xO_3$ at a wavelength $\lambda=580$nm for (x=0.4) and (x=0.5) as function of temperature T(K).
Figure 10:
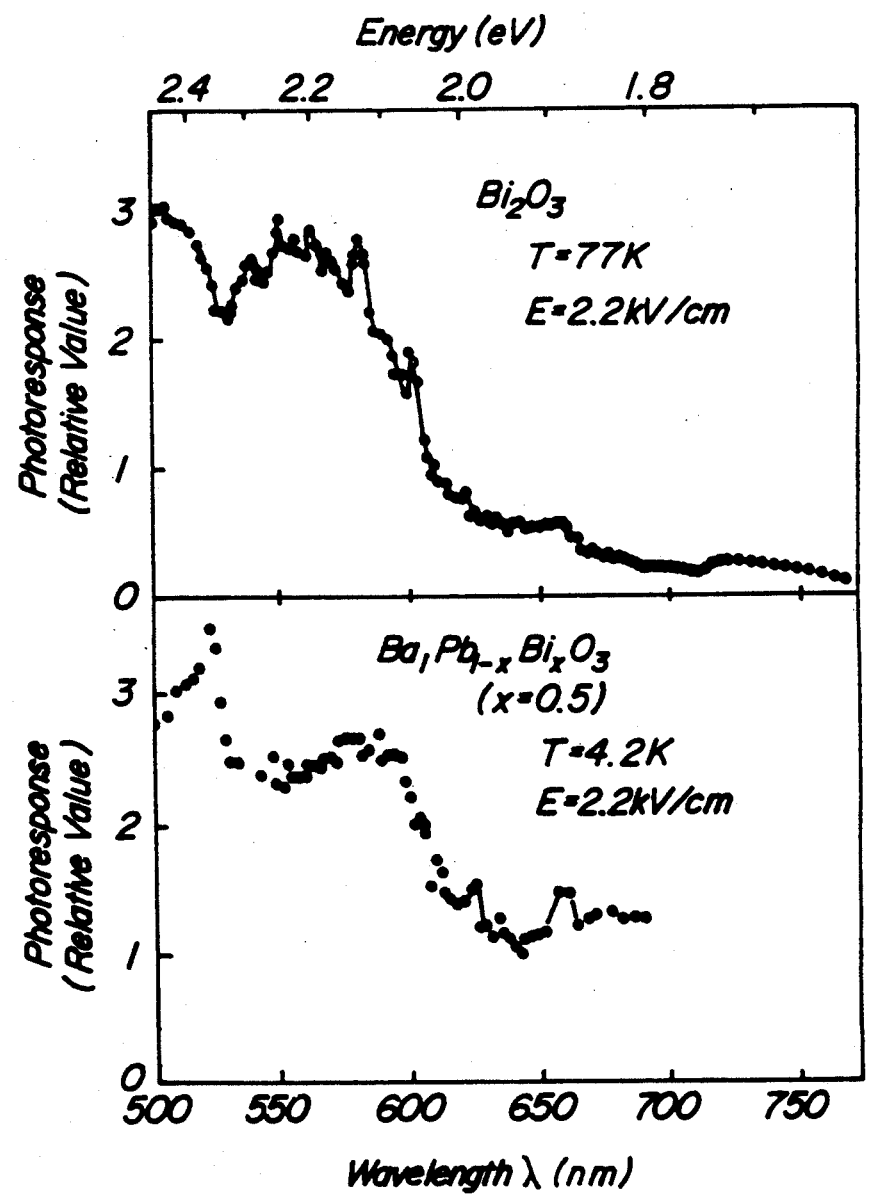
FIG. 10(a) is a graph showing the photoresponse $Q(T,\lambda)$ of the reference substance $Bi_2O_3$ at a temperature of T=77K as a function of wavelength $\lambda$(nm).
FIG. 10(b) is a graph showing the photoresponse $Q(T,\lambda)$ of the substance $Ba_1Pb_{1-x}Bi_xO_3$ (X=0.5) at a temperature of T=4.2K as a function of wavelength $\lambda$(nm).

Oxide material of Ba-Pb-Bi-O system will be described now by referring to FIG. 9 and FIG. 10. Curves (a) and (b) in FIG. 9 show the temperature dependences of photoresponse $Q(T, \lambda)$ of a reference substance $Bi_2O_3$ ceramics and oxide specimens with a general chemical formula of $Ba_1$-$Pb_{1-x}$-$Bi_x$-$O_z$, respectively. Curves (a) and (b) in FIG. 10 show the wavelength dependences of such photoresponse $Q(T, \lambda)$ of the reference substance $Bi_2O_3$ ceramics and the above specimens $Ba_1$-$Pb_{1-x}$-$Bi_x$-$O_z (x=0.5)$, respectively. In the case of the oxides with a general chemical formula of $Ba_1$-$Pb_{1-x}$-$Bi_x$-$O_z$, the inventor found that they reveal superconductivity under the conditions of $0.20 \leq x \leq 0.35$ and $2.81 \leq z \leq 3$, while they reveal photoconductivity under the conditions of $x \geq 0.35$ and $2.7 \leq z \leq 2.81$.

Figure 11:
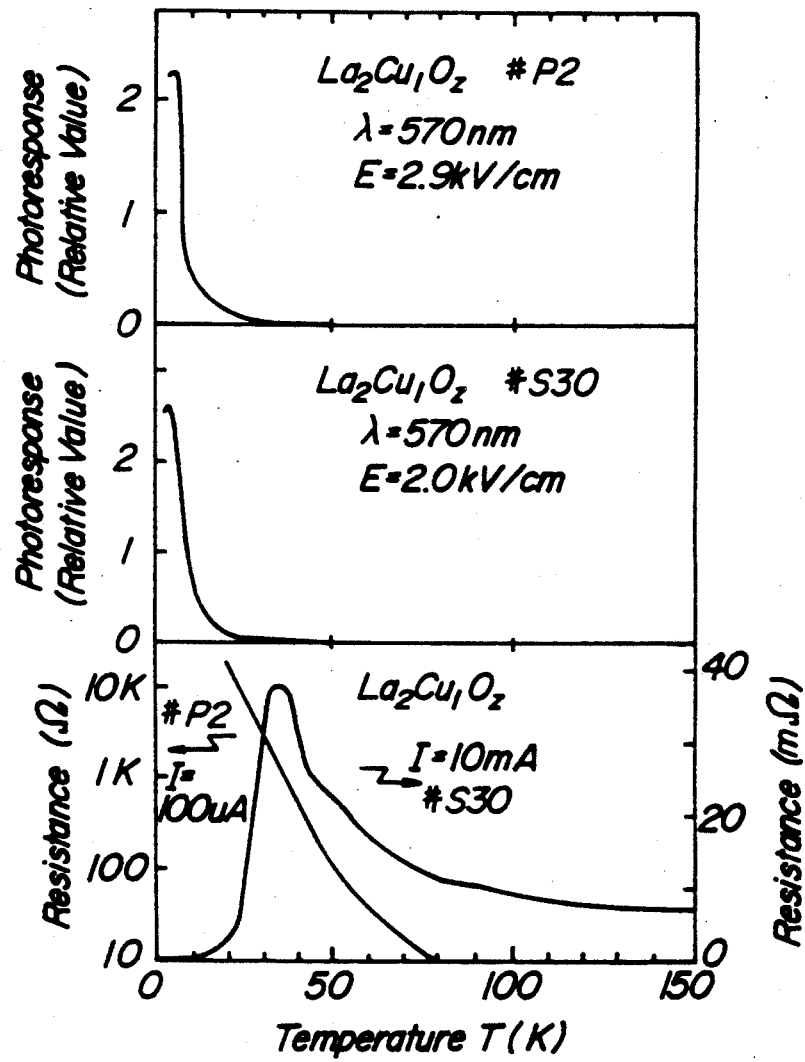
FIG. 11(a) is a graph showing the photoresponse $Q(T,\lambda)$ of the substance $La_2Cu_1 O_z$ at a wavelength $\lambda=570$nm as a function of temperature T(K).
FIg. 11(b) is a graph showing the photoresponse $Q(T,\lambda)$ of the substance $La_2Cu_1Oa$ t a wavelength $\lambda=570$nm as a function of temperature T(K).
FIG. 11(c) is a graph showing a resistance in the dark of the substance $La_2Cu_1O_z$ for z=3.88 and z=3.92 as a function of temperature T(K).
Figure 12:
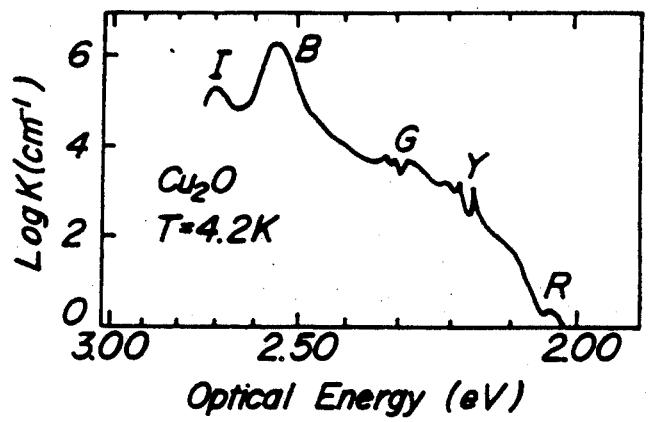
FIG. 12(a) is a graph showing the optical absorption of the reference substance $Cu_2O$ at a temperature T=4.2K.
FIG. 12(b) is a graph showing the photoresponse $Q(T,\lambda)$ of the substance $La_2Cu_1O_z$(z=3.88) at a temperature T=4.2K as a function of wavelength $\lambda$(nm).
FIG. 12(c) is a graph showing the photoresponse $Q(T,\lambda)$ of the substance $La_2Cu_1O_z$(z=3.92) at a temperature T=4.2K as a function of wavelength $\lambda$(nm).
Figure 12:
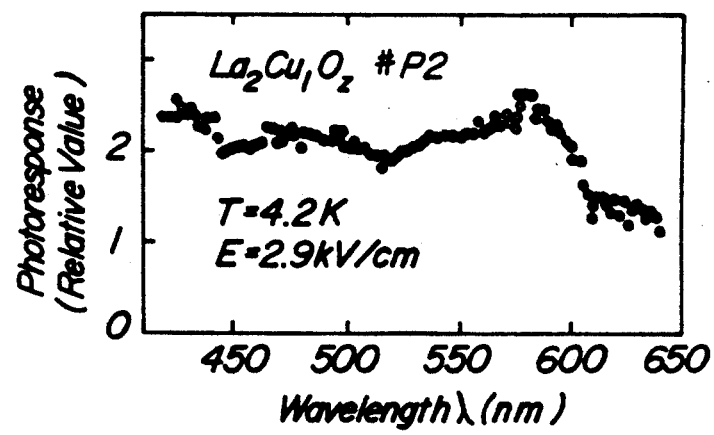
Figure 12:
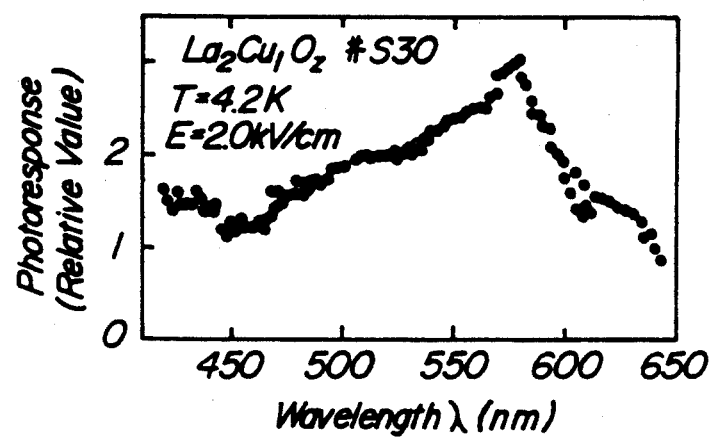
Figure 13:
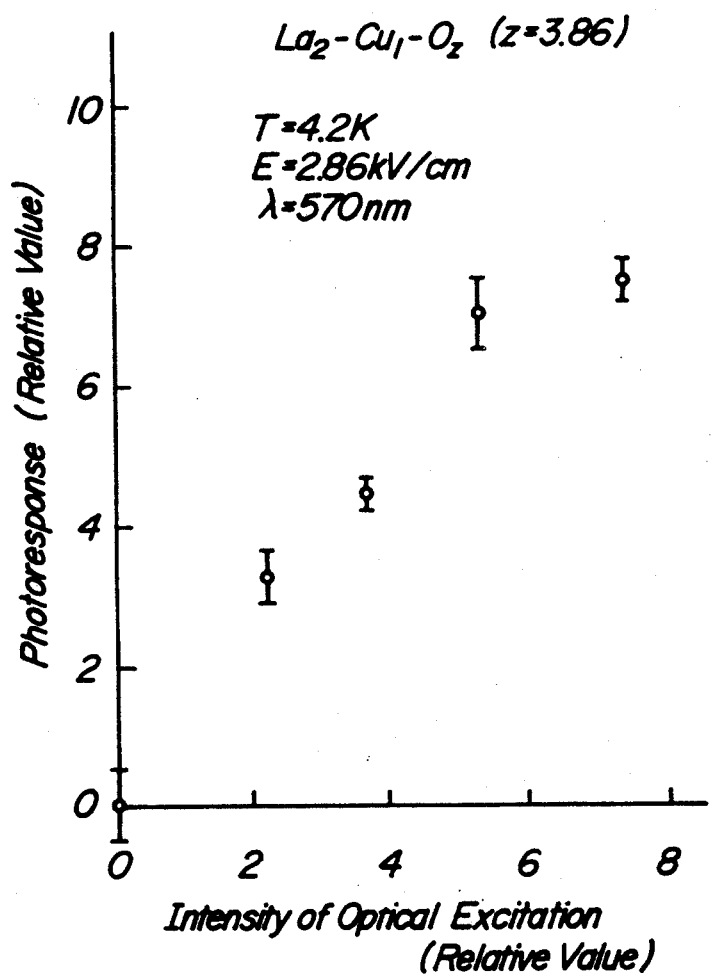
FIG. 13 is a graph to show an example of the relationship between the intensity of excitation light and photoconductive response of La-Cu-O system oxides at $\lambda=570$ nm.

Referring to FIG. 11 through FIG. 13, oxide material of the $La_2$-$Cu_1$-$O_z$ system will be described now. Curves (a) and (b) in FIG. 11 show the temperature dependence of photoresponse $Q(T, \lambda)$ of the oxide for cases of $z=3.88$ and $z=3.92$, respectively. Curve (c) in FIG. 11 shows the temperature dependence of resistance of the oxide in the dark for both $z=3.88$ and $z=3.92$. It has been known that $La_2$-$Cu_1$-$O_z$ system Oxide with $z \geq 3.92$ reveals superconductivity at a temperature below about 30 K. The inventors found that if the oxygen concentration of such oxide is reduced, its superconductivity is converted into photoconductivity as shown in FIG. 11. It was also found that the oxide reveals photoconductivity over a wavelength range of $\lambda \simeq 450-650$ nm as shown by curve (b) (for $z=3.88$) and curve (c) for ($z \simeq 3.92$) in FIG. 9. FIG. 13 shows the relationship between the photoconductivity and the quantity of incident light (i.e., excitation light intensity) for the above oxide with $z \simeq 3.88$. It can be seen from FIG. 13 that the photoresponse current clearly increases with the intensity of incident light.

[EXAMPLES]

Figure 14:
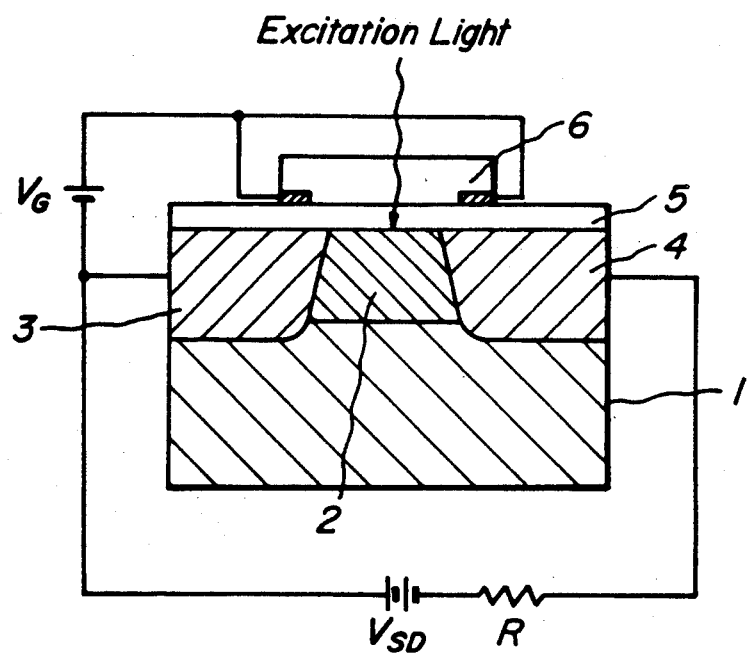
FIG. 14 is a schematic sectional view of a superconductive optoelectronic device according to the invention.

FIG. 14 is a schematic diagram showing the structure of an embodiment of the superconductive optoelectronic device according to the invention. The embodiment is a superconductive phototransistor in which a positive gate voltage $V_G$ is used ($V_G \geq 0$). A substrate 1 is made of $SrTiO_3$, and a photoconductive gate region 2 is formed on the substrate 1 with superconductive photoconductive-material $Ca_2$-$Bi_1$-$Cu_2$-$O_z$. The photoconductive gate region 2 has a width of 0.2 μm to 1.0 mm and, a thickness of 1-10 μm. The above superconductive photoconductive-material $Ca_2$-$Bi_1$-$Cu_2$-$O_z$ reveals photoconductivity in response to excitation by incident light of wavelength at least $\lambda \simeq 540-740$ nm at a temperature below the transition temperature of a superconductive substance $Ca_1$-$Sr_1$-$Bi_1$-$Cu_2$-$O_z$. At opposite portions over the gate region 2, a source region 3 and a drain region 4 are formed with $Ca_1$-$Sr_1$-$Bi_1$-$Cu_2$-$O_z$ oxide which reveals superconductivity below its critical temperature of 80K or 105–115K. An electrically insulating layer 5 which is optically transparent is formed so as to cover top surfaces of the gate region 2, the source region 3, and the drain region 4. The insulating layer 5 of the illustrated example was a 1 μm thick $SiO_2$ film or mylar sheet. Further, a conductive surface of glass layer 6, for instance made of a NESA (Trademark of Pittsburgh Plate Glass Company) glass layer, is placed on the insulating layer 5, and electrodes are deposited on the conductive surface of glass layer 6.

A source for bias voltage $V_G$ is connected across the source region 3 and electrodes of the conductive surface of glass layer and a source for source-drain voltage $V_{SD}$ is connected between the source region 3 and the drain region 4 across the gate region 2.

In preparation of the source region 3 and the drain region 4, it is also possible even to form a comparatively broad region of $Ca_{2-x}$-$Sr_x$-$Bi_1$-$Cu_2$-$O_z$ ($X=0$) at first and then change continuously the concentrations of Ca and Sr so as to produce a gradual concentration change from $x=0$ to $x=1$ in the broad region only at both sides.

In operation, the superconducting optoelectronic element of FIG. 14 is cooled to a temperature below the critical temperatures, i.e., about 80K or 105–115K., of the superconducting zones of $Ca_{2-x}$-$Sr_x$-$Bi_1$-$Cu_2$-$O_z$ and excitation light signals in a wavelength range is irradiated to the gate region 2. A pulsed dye laser of 3 nsec width can be used for an excitation light source. This fact basically indicates a high speed response of the device itself. Thereby, photocarriers are generated in the gate region 2 depending on the photon number or intensity of light incident thereto. The generated carriers are accelerated by the source-drain voltage $V_{SD}$ so as to produce an induced output current which is delivered to an output resistor R. Accordingly, an output voltage due to incident photosignals appears across the resistor R.

The amount and density of optically excited carriers in the gate region 2 can be variable depending not only on the photon number or intensity of incident light thereto but also the bias voltage $V_G$, and the bias voltage $V_G$ can be harmoniously adjusted so as to meet specific requirements from users. By selecting an appreciate wavelength $\lambda$ for excitation light, photocarrier density of the order, e.g., of $10^{12}/cm^3$ can be obtainable in a surface layer of the gate region 2. With the above output current characteristics depending on the intensity of incident light, the superconducting optoelectronic device of FIG. 14 can be used as a superconductive switching device. The source region 3 and the drain region 4 made of superconductive material are free from heat generation during operation, so that the optoelectronic device of FIG. 14 possesses those advantages which are inherent to superconductivity.

Figure 15:
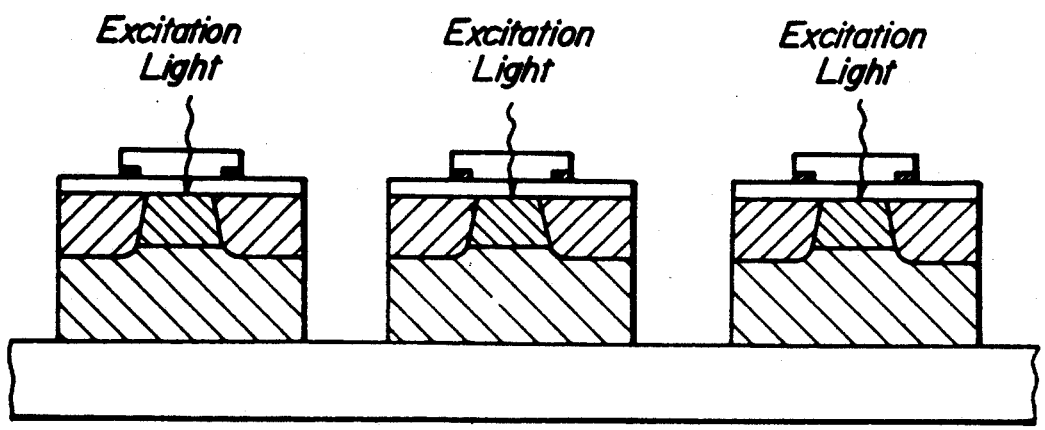
FIG. 15 is a schematic partial sectional view of a superconductive optoelectronic alley device according to the invention.

FIG. 15 is a partial schematic diagram of an embodiment of the superconductive optoelectronic device of the invention, in which device a number of the superconductive optoelectronic devices of FIG. 16 are integrated at a high density in the form of one- or two-dimensional alleys. If wiring among different devices in the device of FIG. 15 is made by using superconducting material, heat generation in the alley or apparatus can be suppressed to an extremely low level. The superconducting optoelectronic device and apparatus of the invention can be used in various fields; for instance, as a loss-free pick up (or camera) devices, loss-free detectors of optical signals in an optical computer which executes parallel operations in a spatially arranged manner, and the like. The device of the invention can be also used in a multiple channel system which selectively utilizes a number of different wavelengths in the incident light.

FIG. 16 schematically illustrates an optical calculation procedure in a projection-correlative optical system of a space parallel optical computer in which system the superconductive optoelectronic devices of the invention are used. As alley-like light source 10 projects a number of optical signals in parallel onto a coding mask pattern 11. The mask pattern 11 carries coding image signals in a mask fashion, which signals correspond to the type of operation to be superposed to the light beams. After passing through the mask pattern 11, the light beams pass a correlative image screen 12 and then enter in parallel into the corresponding devices in a decoding mask optical device alley 13. Each optical device receives a coded signal which is modulated by the mask screen, and operated results can be obtained from the optoelectronic output signals from each of the optical devices. If each optical device of the decoding mask optical device alley 13 is the superconductive optoelectronic device of the invention, parallel optical operations can be effected while minimizing heat generation during the operation.

Although the invention has been described so far by referring to an embodiment in the form of three-terminal device, the superconductive optoelectronic device of the invention can be also made in the form of a two-terminal device. More particularly, carriers generated under the condition of $V_G=0$ in a broad gate region are influenced by the superconductive proximity effect due to superconductive photoconductivity irrespective of a small coherence length, and one can expect that the superconductive optoelectronic device of the invention may be used as a superconductive Josephson junction device based on light irradiation. Thus, such two-terminal device may be treated as a "superconductive photoconductivity or optically controlled Josephson junction device". In this case, the gate width and the intensity of the incident light must be properly selected.

The illustrated embodiment of the invention is made by using the Ca-Sr-Bi-Cu-O system oxides, but other superconductive photoconductive-materials such as those of the Ba-Pb-Bi-O system, La-Cu-O system, or Y-Ba-Cu-O system can be also used to form the superconducting optoelectronic device and apparatus of the invention. For instance, a superconducting optoelectronic device which is similar to the embodiment of FIG. 14 can be made by forming the gate region with $Ba_1-Pb_{0.5}-Bi_{0.5}-O_3$, while forming the source region and the drain region with $Ba_1-Pb_{0.75}-Bi_{0.25}-O_3$.

[DISCUSSION]

The detailed mechanism of the above photoconductive phenomenon of the superconductive photoconductive materials have not been fully clarified yet, but the inventor assumes it on the basis of the concepts "polarons" and excitons as follows. A polaron is a freely moving conduction electron or a positive hole associated with LO-phonons or latice deformations or even more generally with electronic polarization as schematically illustrated in FIG. 17(a). There is also even a concept of "bipolaron" due to coherent electron-phonon interaction or electron-electron correlation effects as illustrated in FIG. 17(b).

Figure 18:
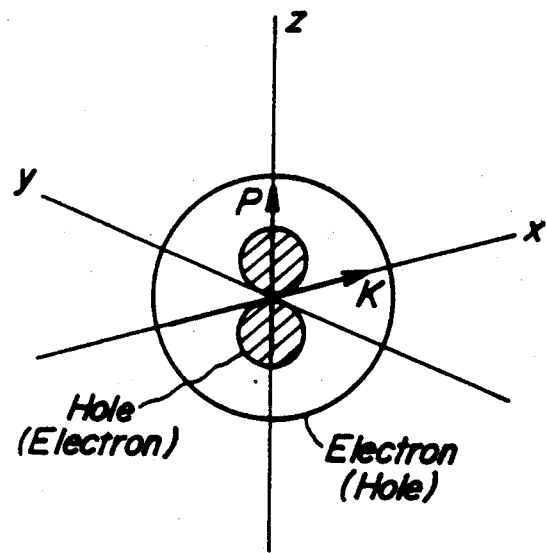
FIGS. 18 illustrate a schematic form of (a) an exciton with a wavevector K and transistion moment P, which sometimes couples with (b) photons with a wavevector $\eta$ and the direction of polarization $\xi$.
Figure 18:
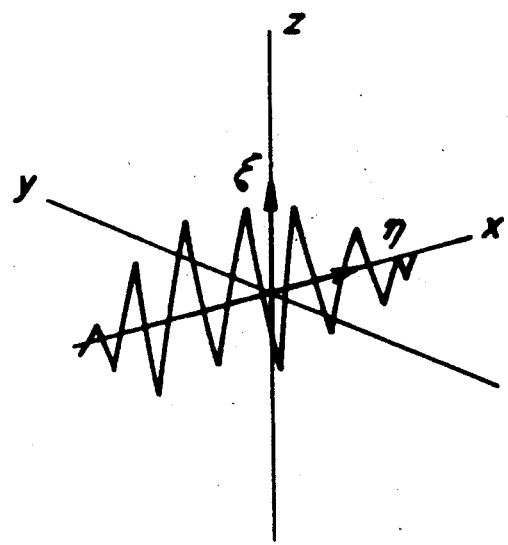

An exciton is an entity of elementary excitation as depicted in FIG. 18(a) which consists of a conduction electron and a positive hole bound together in an atomic hydrogen-like manner, sometimes, hybridized with (b) phonons to compose a "polariton".

The spectral response or photoresponse signal $Q(T, \lambda)$ of the curves (a) and (b) of FIG. 2 implies that there exist such parts in the specimen of $Ca_{2-x}-Sr_x-Bi_{3-y}-Cu_y-O_z$ system oxide which are similar to $Bi_2O_3$ in an atomic sense, e.g., the $(Bi_2O_2)^{2+}$ layer. The phenomena of optical absorption and photoconductivity of $Bi_2O_3$ have been clarified even only in part neither by experiments nor by the exciton theory. However, it is probably a typical example of Frenkel type exciton that is related to and associated with mobile charge in cation shell. The positions of the fine structures in the $Q(\lambda, T)$ in FIG. 2 basically coincide with those of the fundamental absorption edge in $Bi_2O_3$ itself. We can recognize a few prominent fine structures probably due to the excitons, e.g., structures around $\lambda \approx 623$ nm in the photoconductivity spectra of $Ca_2-bi_1-Cu_2-O_3$ similar to those of $Bi_2O_3$ ceramics structure of which appear to correspond to the $n=2$ state in a certain series of excitons of $Bi_2O_3$. Thus, we may reasonably conceive that there exists at least a finite fraction of the $Bi_2O_3$-like part or phase which cannot be ignored in the Ca-Sr-Bi-Cu-O system substance, where the photoexcited electrons and holes are definitely mobile, irrespective of a certain difference of the crystal structures and the density of states. (See FIG. 19 (a))

A conduction electron or a positive hole in standard types of $Bi_2O_3$ or $Cu_2O$ crystals has been reported to form a rather small or large polaron, respectively. However, an onset of "photoconductivity" $Q(\lambda, T)$ even in the insulating specimens is clearly associated with an onset of "superconductivity" as if the superconductivity potentially underlies the photoconductivity phenomenon or vice versa. Thus, as to the effects of a polaron, whether it is a large polaron due to interaction with the LO-phonons, a small one due to the Jahn-Teller effect or possibly an intermediate one due to both effects, the effects of a polaron must be at least potentially important as indicated in FIG. 1 through FIG. 13, as well as "the electronically polarized polaron effect". They are probably effective in a coherently hybridized form of elementary excitations. Here, we must pay special attention to the electronically polarized polarons, which one may call an "excitonic polaron". No one can fail to recognize close association among polarons and excitons with the experimental data here.

Figure 19:
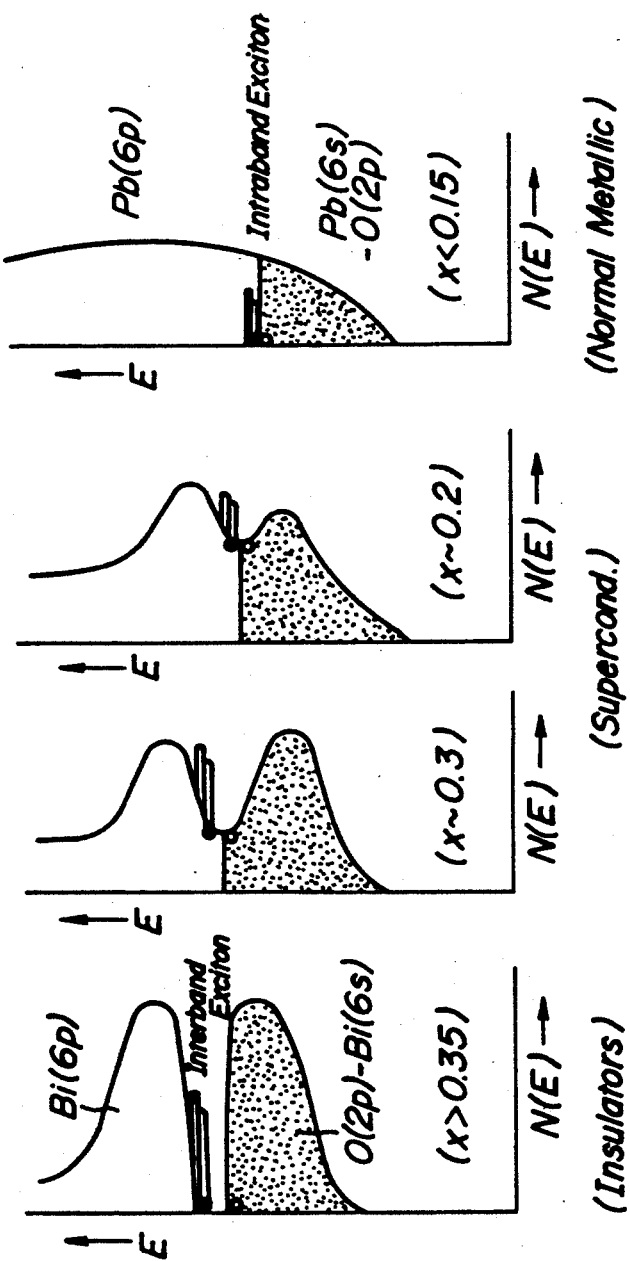
FIGS. 19 are schematic diagrams to show the relationship between energy E and density of state N(E) of (a) the $Ca_{2-x}-S_rx-Bi_{3-y}-Cu_y-O_z$ system, for the cases of x=0 (insulator) and x=1 (superconductor) and both for y=2; and (b) $Ba_1-Pb_{1-x}-Bi_x-O_z$ for the cases of $x \geq 0.35$, x≈0.3, 0.2 and x<0.15.

As shown in FIG. 19 (a), these polarons and excitons in the Ca-Sr-Bi-Cu-O system had yielded out of the optical interband transition from the hybridized oxygen-(2p) and Bi-(6s) valence bands mainly to the Bi-(6p) conduction band together with the LO-phonon interaction, while leaving $O(2p)^6 Bi(6s)^1$ "holes" (represented by a white circle) and creating a $Bi(6p)^1$ conduction electron. However, a polaron in the Ca-Sr-Bi-Cu-O system substance can be created either by the optical excitation or substitution of Ca with Sr perhaps via a chemical pressure. (See FIG. 19 (a) $x=0$ and (b) $x=1$). In this case, the substance becomes superconductive at x=1.) Since the positive holes in the hybrid Bi(6s) and O(2p) bands can be created from the many-body ground state by either an intra- or interband transition, the electron correlation effects naturally important. One must pay more attention to the dynamical valence fluctuation between $Bi^{3+}$ and $Bi^{5+}$ and especially between $Cu^{1+}$ and $Cu^{2+}$, as well as between $Bi^{3+}$ and $Bi^{4+}$ and between $Cu^{2+}$ and $Cu^{3+}$. Therefore, for the mechanism of high-temperature superconductivity, we may reasonably conceive potential roles of an ensemble of polarons, whether large or small, and especially closely associated excitons. The ensemble of united polarons and excitons here are probably a set of bipolarons, polaronic excitons and/or, most probably, "exciton-mediated bipolarons" due to the dynamical electron-phonon and electron correlation effects.

Figure 20:
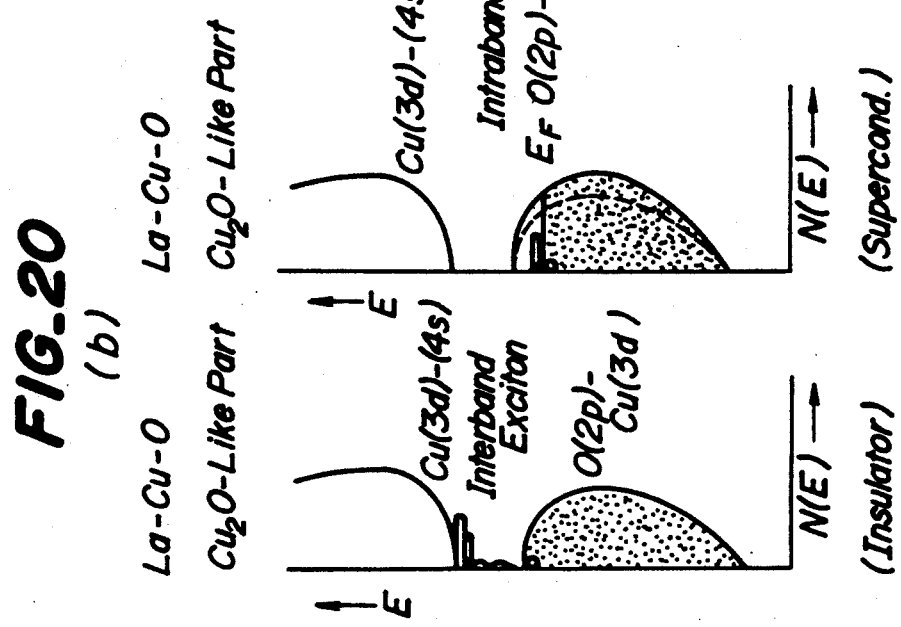
FIGS. 20 are schematic diagrams to show the relationship between energy E and density of state N (E) of the $Y_{3-x}-Ba_xCu_3-O_z$, and (b) the $La_2-Cu_1-O_z$ systems.

The photoresponse signals $Q(T, \lambda)$ of Ca-Sr-Bi-Cu-O system substance as depicted by the curve (b) in FIG. 2 are very similar to those of $Bi_2O_3$ ceramics of the curve (a) in FIG. 2. Consequently, we believe that these studies of elementary excitations here must reveal the nature of superconducting ground state, irrespective of an enormous difference in carrier density. In both, the an excited state via elementary excitation (insulator) in FIG. 19 (a) and the ground state (superconductor) in FIG. 19 (b), one can expect occurrence of similar phenomena to those of the Josephson effect. Similar situations must be the cases also for the Ba-Pb-Bi-O, Y-Cu-O, Y-Ba-Cu-O, La-Cu-O systems but with other reasoning as suggested in FIG. 19(b) and FIGS. 20(a) and (b).

To the best of our knowledge, this is the first clear experimental indication of the polaron and exciton mechanisms displayed in the high-temperature superconductivity of Ca-Sr-Bi-Cu-O, Ca(Y)-Sr-Bi-Cu-O, Y-Cu-O, Y-Ba-Cu-O, Ba-Pb-Bi-O, and La-Cu-O system substances.

[EFFECT OF THE INVENTION]

As described in detail in the foregoing, a superconductive optoelectronic device according to the invention comprises a source region, a drain region, the two regions being made of superconductive material, and a gate region made of "superconductive photoconductive-material" revealing photoconductivity at a temperature below the transition temperature of the above superconductive material. Thus, the invention provides an optoelectronic device with intrinsic "superconductive properties", i.e., extremely low generation rate of heat such as Joule heat during operation, and it facilitates development of various novel superconducting devices such as "an optically controllable superconductive Josephson junction devices" and "superconductive phototransistors".

Further, a two-dimensional alley-like device with a high density integration of the superconductive optoelectronic devices of the invention has such electrodes and lead wire terminals which are of perfect diamagnetism, so that it is free from noises and interferences due to mutual electromagentic induction between adjacent devices or due to outside magnetic fields. Therefore, the invention enables production of an ideal "superconductive optoelectronic device or apparatus" which operates under optimal thermal and electromagentic conditions, such as a space parallel optical computer with a very high operating speed.

In short, the present invention is a pioneer in novel scientific field of "Superconductive Opto-Electronics".

Although the invention has been described with a certain degree of particularity, it must be understood that the present disclosure has been made only by way of example and that numerous variations in details may be resorted to without departing from the scope of the invention as hereinafter claimed.

What is claimed is:

1. A superconductive optoelectronic device, comprising a substrate, a photoconductive gate region formed on the substrate, and a source region and a drain region formed on the substrate at opposite sides of the gate region, respectively, so as to face toward each other across the gate region, and means for supplying bias voltage between said source region and drain region, said source and drain regions being made of a superconductive material, said gate region being made of a superconductive photoconductive-material selected from the Y-Ba-Cu-O, Ca-Sr-Bi-Cu-O, Ba-Pb-Bi-O and La-Cu-O systems, which gate material is photoconductive at a temperature below the critical temperature for superconductivity of said superconductive material, whereby an electric current flowing between said source region and drain region is controlled in accordance with the intensity of light incident upon the gate region.

2. A superconductive optoelectronic device as in claim 1, wherein the photoconductive gate region is made of a superconductive photoconductive-material having a general chemical formula of $Y_{3-x}\text{-}Ba_x\text{-}Cu_y\text{-}O_z$ wherein $0 \leq x \leq 1$, $y=3$, $7.0 \leq z \leq 7.5$, and said source region and said drain region are made of a superconducting material having a general chemical formula of $Y_{3-x}\text{-}Ba_x\text{-}Cu_y\text{-}O_z$ wherein $1 \leq x \leq 2$, $y=3$, $6.5 \leq z \leq 7$.

3. A superconductive optoelectronic device as in claim 1, wherein the photoconductive gate region is made of a superconductive photoconductive-material having a general chemical formula of $Y_{3-x}\text{-}Ba_x\text{-}Cu_y\text{-}O_z$ wherein $x=2$, $y=3$, $6.0 \leq z < 6.5$, and said source region and said drain zone are made of a superconductive material having a general chemical formula of $Y_{3-x}\text{-}Ba_x\text{-}Cu_y\text{-}O_z$ wherein $1 \leq x \leq 2$, $y=3$, $6.5 \leq z \leq 7$.

4. A superconductive optoelectronic device as in claim 1, wherein the photoconductive gate region is made of a superconductive photoconductive-material having a general chemical formula of $La_2\text{-}Cu_1\text{-}O_z$ wherein $3.86 \leq z \leq 3.92$, and said source region and said drain region are made of a superconductive material having a general chemical formula of $La_2\text{-}Cu_1\text{-}O_z$ wherein $3.92 \leq z \leq 4.02$.

5. A superconductive optoelectronic device, comprising a substrate, a photoconductive gate region formed on the substrate, and a source region and a drain region formed on the substrate at opposite sides of the gate region, respectively, so as to face toward each other across the gate region, and means for supplying bias voltage between said source region and drain region, said source and drain regions being made of a superconductive material, said gate region being made of a superconductive photoconductive-material having a general chemical formula of $Ca_{m-x}\text{-}Sr_x\text{-}Bi_{n-y}\text{-}Cu_y\text{-}O_z$ wherein $2 \leq m \leq 4$, $0 \leq x < 1$, $3 \leq n \leq 5$, $1 \leq y \leq 3$, $4 \leq z \leq 11$, which gate material is photoconductive at a temperature below the critical temperature for superconductivity of said superconductive material and said source region and said drain region are made of a superconductive material having a general chemical formula $Ca_{m-x}$-$Sr_x$-$Bi_{n-y}$-$Cu_y$-$O_z$ wherein $2 \leq m \leq 4$, $1 \leq x \leq 2$, $3 \leq n \leq 5$, $1 \leq y \leq 3$, $4 \leq z \leq 11$, whereby an electric current flowing between said source region and drain region is controlled in accordance with the intensity of light incident upon the gate region.

6. A superconductive optoelectronic device, comprising a substrate, a photoconductive gate region formed on the substrate, and a source region and a drain region formed on the substrate at opposite sides of the gate region, respectively, so as to face toward each other across the gate region, and means for supplying bias voltage between said source region and drain region, said source and drain regions being made of a superconductive material, said gate region being made of a superconductive photoconductive-material having a general chemical formula of $Ba_1$-$Pb_{1-x}$-$Bi_x$-$O_z$ wherein $0.35 \leq x$, $2.7 \leq z \leq 3$, which gate material is photoconductive at a temperature below the critical temperature for superconductivity of said superconductive material and said source region and said drain region are made of a superconductive material having a general chemical formula $Ba_1$-$Pb_{1-x}$-$Bi_x$-$O_z$ wherein $0.2 \leq x \leq 0.35$, $2.81 \leq x \leq 3$, whereby an electric current flowing between said source region and drain region is controlled in accordance with the intensity of light incident upon the gate region.

7. A superconductive optoelectronic device as in claim 1, wherein said photoconductive gate material has an onset temperature of photoconductivity upon light excitation in correspondence with the onset temperature of superconductivity of said superconductive material.

8. A superconductive optoelectronic device as in claim 1, wherein the superconductive photoconductive-material forming the gate region and the superconductive material forming the source and drain regions are of the same general chemical formula but which differ in the proportion of the constitutent elements thereof.

9. A superconductive optoelectronic device as in claim 2, wherein the photoconductive gate material is an insulator in the dark and exhibits photoconductivity $Q(\lambda, T)$ by light excitation within a wavelength ($\lambda$) of from 420–640 nm at a temperature (T) below 90K, when $x=0$.

10. A superconductive optoelectronic device as in claim 2, wherein the photoconductive gate material is photoconductive by light excitation within a wavelength range of from 420–640 nm at a temperature below 90K.

11. A superconductive optoelectronic device as in claim 4, wherein the photoconductive gate material is photoconductive by light excitation within a wavelength range of from 450–650 nm at a temperature below 20K.

12. A superconductive optoelectronic device as in claim 5, wherein the photoconductive gate material is photoconductive by light excitation within a wavelength range of from 540–740 nm at a temperature below 80K.

13. A superconductive optoelectronic device as in claim 6, wherein the photoconductive gate material is photoconductive by light excitation within a wavelength range of from 500–690 nm at a temperature below 20K.

* * * * *